(12) United States Patent
Sadovnikov

(10) Patent No.: US 6,967,144 B1
(45) Date of Patent: Nov. 22, 2005

(54) LOW DOPED BASE SPACER FOR REDUCTION OF EMITTER-BASE CAPACITANCE IN BIPOLAR TRANSISTORS WITH SELECTIVELY GROWN EPITAXIAL BASE

(75) Inventor: Alexei Sadovnikov, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/669,045

(22) Filed: Sep. 23, 2003

Related U.S. Application Data

(62) Division of application No. 09/885,462, filed on Jun. 20, 2001, now abandoned.

(51) Int. Cl.[7] ................ H01L 21/331; H01L 27/082; H01L 27/102; H01L 29/70; H01L 31/11
(52) U.S. Cl. ............ 438/350; 438/349; 257/565; 257/592
(58) Field of Search ............... 438/350; 257/565–575

(56) References Cited

U.S. PATENT DOCUMENTS

| | | | | |
|---|---|---|---|---|
| 4,086,610 A | * | 4/1978 | Clark et al. ............. | 257/592 |
| 5,016,075 A | | 5/1991 | Minato .................... | 357/35 |
| 5,041,892 A | | 8/1991 | Yano et al. .............. | 357/34 |
| 5,250,448 A | | 10/1993 | Hamasaki et al. ....... | 437/31 |
| 5,315,151 A | | 5/1994 | Hsieh et al. ............. | 257/592 |
| 5,340,753 A | | 8/1994 | Bassous et al. .......... | 437/31 |
| 5,404,028 A | * | 4/1995 | Metzger et al. .......... | 257/15 |
| 5,412,228 A | | 5/1995 | Baliga .................... | 257/133 |
| 5,440,152 A | | 8/1995 | Yamazaki ............... | 257/197 |
| 5,494,836 A | * | 2/1996 | Imai ....................... | 437/312 |
| 5,504,018 A | * | 4/1996 | Sato ....................... | 438/350 |
| 5,508,553 A | * | 4/1996 | Nakamura et al. ...... | 257/576 |
| 5,668,396 A | | 9/1997 | Sato ....................... | 257/517 |
| 5,698,890 A | | 12/1997 | Sato ....................... | 257/592 |
| 5,789,800 A | | 8/1998 | Kohno .................... | 257/588 |
| 5,793,067 A | * | 8/1998 | Miura et al. ............. | 257/183 |
| 5,930,635 A | | 7/1999 | Bashir et al. ............ | 438/313 |
| 5,981,985 A | * | 11/1999 | Yang et al. .............. | 257/198 |
| 6,049,098 A | * | 4/2000 | Sato ....................... | 257/198 |
| 6,087,683 A | * | 7/2000 | King et al. .............. | 257/183 |
| 6,337,494 B1 | | 1/2002 | Ryum et al. ............. | 257/197 |
| 6,346,453 B1 | | 2/2002 | Kovacic et al. .......... | 438/312 |
| 2003/0001235 A1 | | 1/2003 | Hashimoto ............... | 257/592 |

FOREIGN PATENT DOCUMENTS

EP  1 139 408 A2  10/2001  ......... H01L/21/331

OTHER PUBLICATIONS

King et al., Very Low Cost Graded SiGe Base Bipolar Transistors for a High Performance Modular BiCMOS Process, 1999, IEDM 99, pp. 565–568.*

A. Schuppen et al. "Enhanced SiGe Heterojunction Bipolar Transistors with 160 GHz–$f_{max}$", IEDM 95 743–746, 1995 IEEE.

Denny D. Tang, "A Reduced–Field Design Concept for High–Performance Bipolar Transistors", IEEE Electron Device Letters, vol. 10, No. 2, Feb. 1989, pp 67–69.

* cited by examiner

*Primary Examiner*—Tom Thomas
*Assistant Examiner*—Jesse A. Fenty
(74) *Attorney, Agent, or Firm*—Stallman & Pollock LLP

(57) ABSTRACT

A bipolar transistor structure includes a collector region having a first conductivity type formed in a semiconductor substrate. A base region is formed over the collector region; the base region includes a highly doped lower layer having a second conductivity type opposite the first conductivity type formed on the collector region and a relatively low doped (or undoped) upper layer formed on the highly doped lower layer. An emitter region having the first conductivity type is formed on the upper layer of the base region.

5 Claims, 3 Drawing Sheets

LOW DOPED BASE SPACER FOR REDUCTION OF EMITTER-BASE CAPACITANCE IN BIPOLAR TRANSISTORS WITH SELECTIVELY GROWN EPITAXIAL BASE

This application is a Divisional of Ser. No. 09/885,462, filed Jun. 20, 2001, now abandoned.

BACKGROUND OF THE INVENTION

1. Field of the Invention

The present invention relates to semiconductor integrated circuits and, in particular, to a bipolar transistor structure that includes a low-doped (or undoped) base spacer layer between the emitter and a high-doped base layer and small emitter-base capacitance, thereby resulting in small emitter-base capacitance.

2. Discussion of the Related Art

FIG. 1 shows a conventional silicon-geranium (SiGe) bipolar junction transistor (BJT) 100 that is manufactured using a selectively grown epitaxy (SEG) base. A sketch of the impurity distribution under the emitter polysilicon layer of the FIG. 1 BJT structure is shown in solid lines in FIG. 2.

The FIG. 1 BJT structure includes a collector region 102 that is formed in a shallow trench isolated (STI) portion of a N-type semiconductor (typically silicon) substrate. A P-type epitaxial SiGe base region 104 is formed on the collector region 102. N-doped polysilicon emitter 106 is formed over the base region 104. An epitaxial doped silicon emitter capping layer 108 is formed beneath the emitter 106.

As shown in FIG. 2, the base boron concentration Bhigh of the conventional BJT device is very high, i.e.>5E18/cm$^3$. This results in both a noticeable tunneling current through the emitter-base junction, which contributes to the base current and reduces Beta, and high emitter-base capacitance, which reduces transit frequency fT, especially at low currents.

To reduce emitter-base tunneling in BJT structures, Schuppen et al., "Enhanced SiGi Heterojunction Bipolar Transistors with 160 Gh2-$f_{max}$.", IEDM Technical Digest, p. 743 (1995), suggest depositing a low-doped n-type emitter spacer layer on top of the boron-doped base layer, i.e. between the n-type emitter and the p-type base (see FIG. 1). However, molecular beam epitaxy (MBE) is required to implement the necessary dopant profile and MBE is not a commercially-viable manufacturing technique.

SUMMARY OF THE INVENTION

An embodiment of the present invention provides a bipolar transistor structure that includes a collector region of n-type conductivity formed in a shallow trench isolated portion of a silicon substrate. A two-layer base region is formed on the collector region; the two-layer base region includes a lower, highly doped P-type layer that is formed on the collector region and an upper, relatively low doped P-type (or undoped) layer formed above the highly doped layer. A n-doped polysilicon emitter is formed over the upper layer of the base region.

The features and advantages of the present invention will be more fully appreciated upon consideration of the following detailed description of the invention and the accompanying drawings.

DETAILED DESCRIPTION OF THE INVENTION

Figure 1:
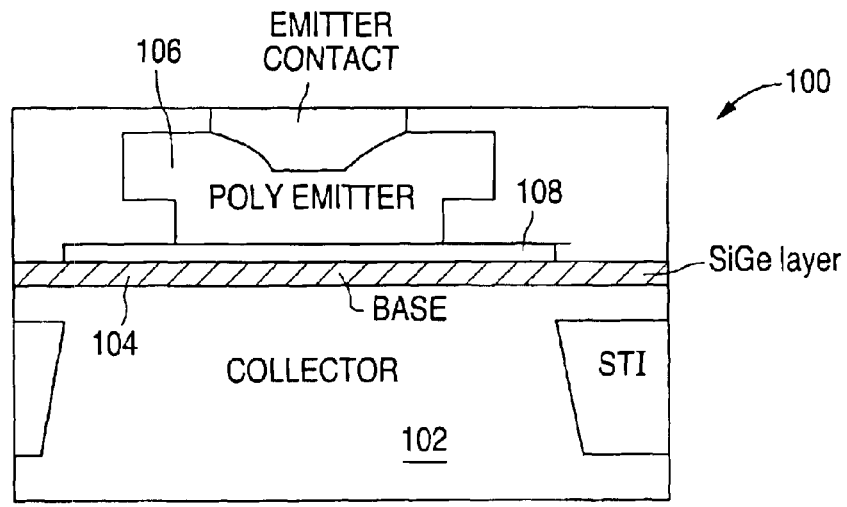
FIG. 1 is a cross-section view illustrating a conventional SiGe bipolar junction transistor (BJT) with shallow trench isolation (STI).
Figure 2:
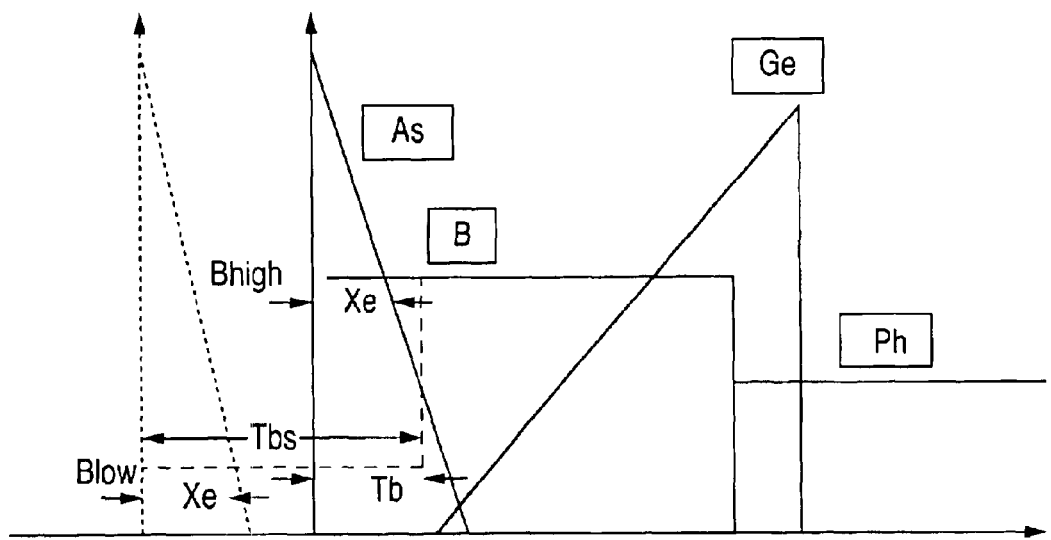
FIG. 2 provides a sketch of the impurity distribution beneath the center of a polysilicon emitter in the FIG. 1 transistor structure, the solid line showing the impurity distribution without a base spacer, the dashed line showing the distribution with a base spacer in accordance with the present invention.

In accordance with the present invention, the n-doped emitter spacer of the type disclosed by Schuppen et al. is replaced by a low-doped, or even un-doped, base spacer as shown by dashed lines in FIG. 2 (where Blow is boron concentration). This can be accomplished by switching off the dopant source, typically boron, at the final stage of the base epitaxial growth.

Figure 3:
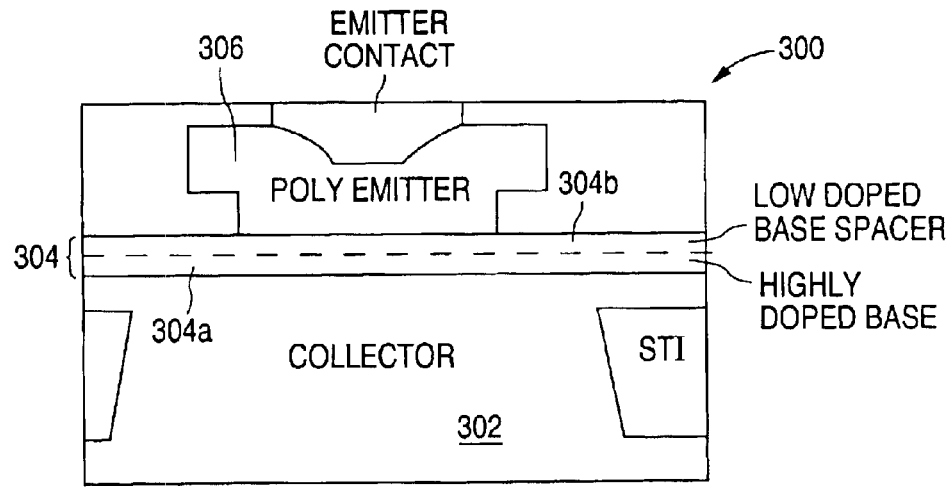
FIG. 3 is a cross-section view illustrating a bipolar transistor structure in accordance with the concepts of the present invention.

A bipolar device structure 300 in accordance with the present invention is shown in the FIG. 3. The device 300 includes a n-type collector region 302 formed in a portion of a shallow trench isolated (STI) silicon substrate. A P-type base region 304 is formed on the collector region 302; the base region includes a lower layer 304a of highly p-doped (e.g., boron) epitaxial SiGe material and an upper layer 304b of relatively low p-doped (or undoped) SiGe material. The dopant concentration of the upper layer 304b should be about minus 10× or less than the dopant concentration of the lower layer 304a. Those skilled in the art will appreciate that a typical dopant concentration of the lower layer 304a is about 1E19; therefore, in this case, the dopant concentration of the upper spacer layer would be about 1E18 or less. A n-doped polysilicon emitter region 306 is formed on the upper base layer 304b.

The real boron profile can be different from the ideal profile shown in FIG. 2, but what is required is to lower the base doping in the thin upper layer 304b between highly doped p-type lower base layer 304a and the n-type emitter region 306. This layer base structure will cause the emitter-base space-charge region to spread into the low-doped base spacer 304b and its thickness will increase. This results in a desirable decrease of junction capacitance and tunneling. However, if the thickness of the base spacer 304b is smaller than the thickness of the emitter-base space charge region, then the thickness of the quasi-neutral base will not increase. Hence, the maximum transit frequency (fTpeak) will remain nearly the same.

Figure 4A:
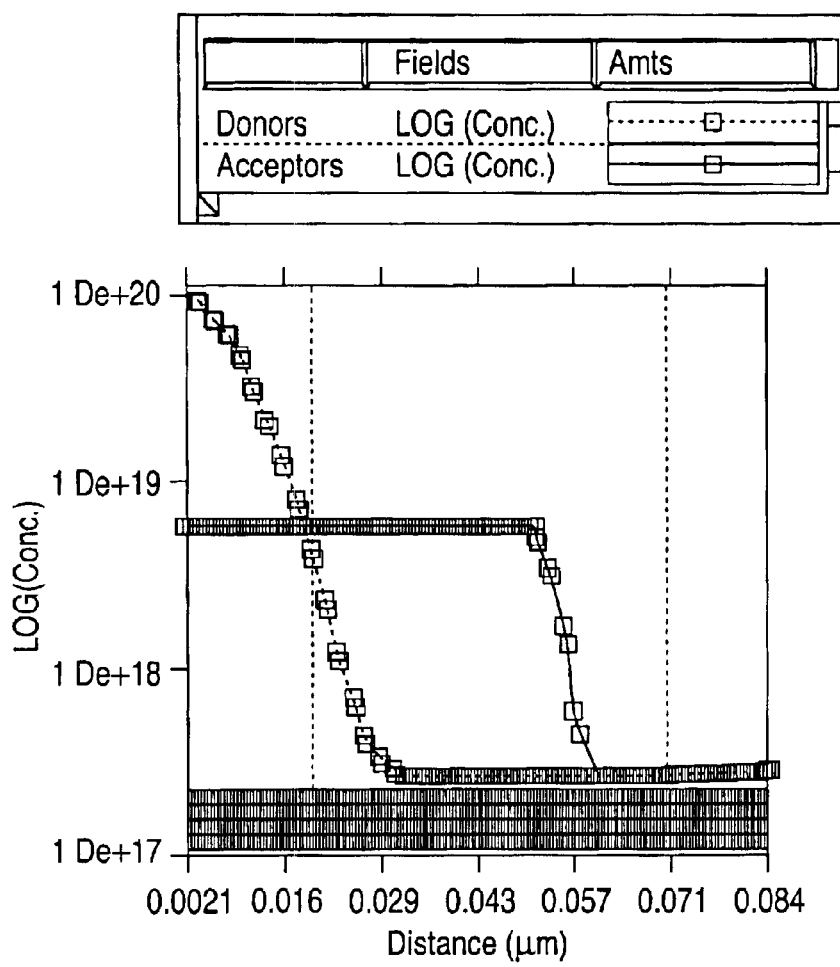
FIG. 4A shows one-dimensional donor and acceptor distributions under the polysilicon emitter used in simulation without a base spacer.
Figure 4B:
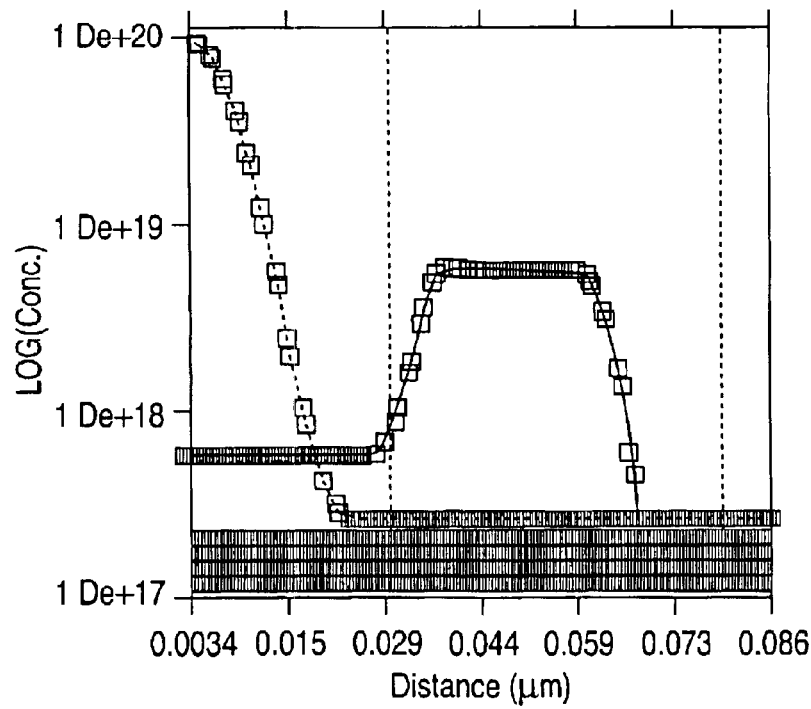
FIG. 4B shows a one-dimensional donor and acceptor distributions under the polysilicon emitter used in simulation with a base spacer in accordance with the present invention.

In order to illustrate this effect, two dimensional simulations of the SiGe NPN BJT were made using the well known MEDICI program. Acceptor and donor profiles under the polysilicon emitter layer which were used in simulation are shown in FIGS. 4A and 4B for structures without and with a base spacer, respectively. A few structures with no base spacer and different base spacer thickness were simulated.

Figure 5:
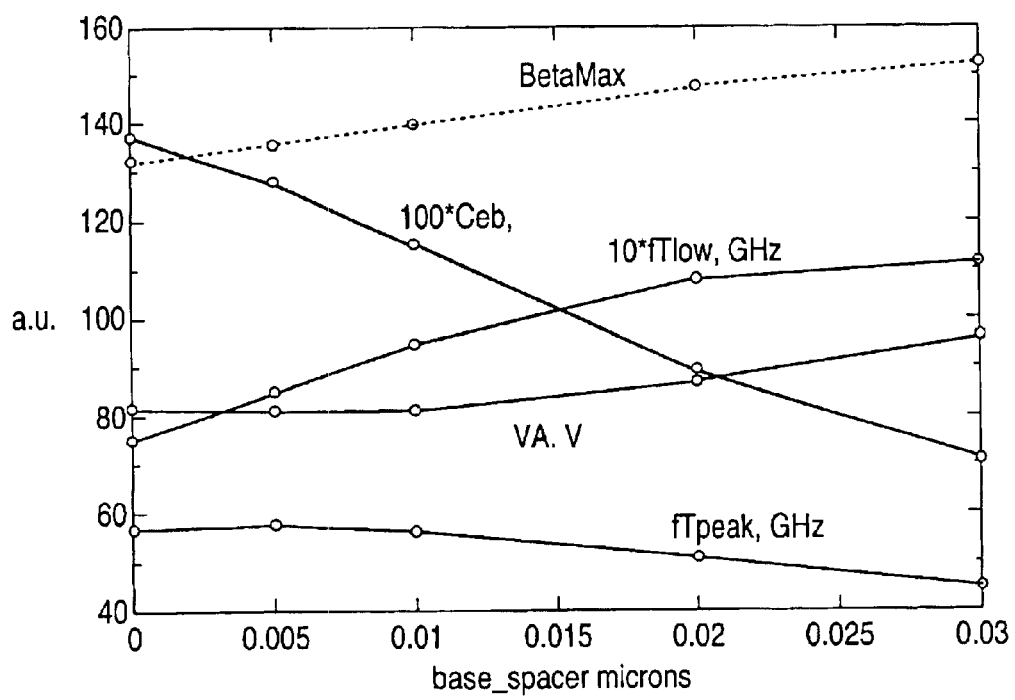
FIG. 5 is a graph showing dependence of BJT parameters on a portion of the base spacer thickness in accordance with the present invention between the highly doped base and the emitter, Tbs-Xe in FIG. 2.

The dependence of the calculated BJT parameters on the base spacer thickness is shown in FIG. 5. The thickness of the highly doped base region 304a was tuned in order to maintain approximately the same maximum Beta (BetaMax) values for all structures.

One can see drastic reduction of the emitter-base capacitance (Ceb) when the thickness of the low doped base spacer 304b increases. Results also show that there is a range of the base spacer 304b thickness in which transit frequency fT at low current (fTlow), calculated at 25 uA/um2, increases significantly while maximum transit frequency fTpeak decreases only a little. For larger base spacer thickness, maximum transit frequency fTpeak decreases drastically due to increase in the quasi-neutral base thickness.

Given the above detailed description of the invention and the embodiments of the invention described therein, it is intended that the following claims define the scope of the invention and that structures and methods within the scope of these claims and their equivalents be covered thereby.

What is claimed is:

1. A method of forming a bipolar transistor structure, the method comprising:

forming a shallow trench isolated (STI) active device region in a silicon substrate;

forming a collector region of n-type conductivity in the STI active device region;

forming a lower layer of P-doped epitaxial SiGe material on the n-type collector region;

forming an upper layer of p-doped epitaxial SiGe material on the lower layer of SiGe material, the dopant concentration of the upper layer being at least about minus 10× or less lower than the dopant concentration of the lower layer; and forming an n-doped polysilicon emitter region on the upper layer of SiGe material.

2. A method as in claim 1, and wherein the dopant concentration of the lower layer of SiGe material is about 1E19 and the dopant concentration of the upper layer of SiGe material is about 1E18.

3. A method as in claim 1, and wherein the p-type dopant in the lower layer of SiGe material comprises boron.

4. A method as in claim 3, and wherein the p-type dopant in the upper layer of SiGe material comprises boron.

5. A method as in claim 1, and wherein the dopant concentration in the upper layer of SiGe material is zero.

* * * * *